(12) United States Patent
Park et al.

(10) Patent No.: US 9,153,603 B2
(45) Date of Patent: Oct. 6, 2015

(54) THIN FILM TRANSISTOR ARRAY PANEL AND METHOD OF MANUFACTURING THE SAME

(71) Applicant: Samsung Display Co., Ltd., Yongin, Gyeonggi-Do (KR)

(72) Inventors: Ji-Young Park, Hwaseong-si (KR); Dong Il Kim, Suwon-si (KR); Sang Gab Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 22 days.

(21) Appl. No.: 14/105,048

(22) Filed: Dec. 12, 2013

(65) Prior Publication Data

US 2014/0367706 A1    Dec. 18, 2014

(30) Foreign Application Priority Data

Jun. 14, 2013 (KR) .......................... 10-2013-0068367

(51) Int. Cl.
*H01L 21/00* (2006.01)
*H01L 27/12* (2006.01)

(52) U.S. Cl.
CPC .......... *H01L 27/124* (2013.01); *H01L 27/1259* (2013.01)

(58) Field of Classification Search
CPC ........................ H01L 27/124; H01L 27/1259
USPC ............................. 438/34, 48, 149, 637, 640
See application file for complete search history.

(56) References Cited

U.S. PATENT DOCUMENTS

2010/0051935 A1*   3/2010   Lee et al. ........................ 257/43

FOREIGN PATENT DOCUMENTS

| JP | 08-146466 A | 6/1996 |
| JP | 2001-160548 A | 6/2001 |
| KR | 1995-0008698 B1 | 8/1995 |
| KR | 10-0169601 B1 | 2/1999 |
| KR | 10-2011-0127919 A | 11/2011 |
| KR | 10-2013-0011856 A | 1/2013 |
| KR | 10-2014-0122623 A | 10/2014 |

* cited by examiner

*Primary Examiner* — H Tsai
(74) *Attorney, Agent, or Firm* — Knobbe Martens Olson & Bear, LLP

(57) ABSTRACT

A thin film transistor array panel includes a substrate; a gate line located over the substrate and including a gate pad portion; a data line located over the gate line and including a source electrode and a data pad portion; a drain electrode; a first passivation layer located over the data line and the drain electrode; an organic insulating layer located over the first passivation layer and having a contact hole; a first field generating electrode located over the organic insulating layer and having an opening; a second passivation layer located over the first field generating electrode; and a second field generating electrode located over the second passivation layer. The contact hole coincides with or is smaller than the opening, and the contact hole has a tapered structure.

10 Claims, 40 Drawing Sheets

THIN FILM TRANSISTOR ARRAY PANEL AND METHOD OF MANUFACTURING THE SAME

CROSS-REFERENCE TO RELATED APPLICATION

This application claims priority to and the benefit of Korean Patent Application No. 10-2013-0068367 filed in the Korean Intellectual Property Office on Jun. 14, 2013, the entire contents of which are incorporated herein by reference.

BACKGROUND (a) Technical Field

The present disclosure relates to a thin film transistor array panel and a method for manufacturing the same.

(b) Description of the Related Art

A liquid crystal display is one of flat panel displays which are widely used at present, and includes two display panels and a liquid crystal layer interposed therebetween. Each of the display panels has field generating electrodes such as a pixel electrode and a common electrode. The liquid crystal display applies a voltage to the field generating electrodes so as to generate an electric field in the liquid crystal layer, thereby changing the orientation of liquid crystal molecules of the liquid crystal layer through the electric field, and controls polarization of incident light to display an image.

In the liquid crystal display, both of the two field generating electrodes for generating an electric field in the liquid crystal layer may be formed over a thin film transistor array panel.

When the two field generating electrodes are formed over the thin film transistor array panel, a plurality of insulating layers may be disposed between a thin film transistor and a field generating electrode, and at least one of the insulating layers may be made of an organic insulator. Contact holes for electrically connecting the thin film transistor and the field generating electrode are formed through the plurality of insulating layers.

The above information disclosed in this Background section is only for enhancement of understanding of the background of the invention and therefore it may contain information that does not form the prior art that is already known in this country to a person of ordinary skill in the art.

SUMMARY

One aspect of the invention provides a thin film transistor array panel which has a self-aligned tapered structure when an organic layer is etched through a photosensitive film pattern of a field generating electrode and a method for manufacturing the same.

An exemplary embodiment of the present invention provides a thin film transistor array panel including: an insulation substrate; a gate line located over the insulation substrate and including a gate pad portion comprising a major surface; a data line crossing the gate line while insulated from the gate line and including a source electrode and a data pad portion; a drain electrode spaced from the source electrode; an organic insulating layer located over the data line and the drain electrode and including a contact hole formed therethrough; and a first field generating electrode located over the organic insulating layer and comprising an opening overlapping the contact hole when viewed in a viewing direction perpendicular to the major surface. The contact hole coincides with or is smaller than the opening of the first field generating electrode, and each of the contact hole and the opening include a tapered structure.

The opening and the contact hole may coincide with each other.

The organic insulating layer may include a non-photosensitive material.

Another embodiment of the invention provides a thin film transistor array panel comprising an organic insulating layer located over the data line and the drain electrode; and comprising a plurality of contact holes formed therethrough; and a first field generating electrode located over the organic insulating layer and comprising a plurality of openings, each of which overlaps one of the plurality of contact holes when viewed in a viewing direction perpendicular to the major surface. The plurality of contact holes may include: a first contact hole exposing at least a part of the gate pad portion; and a second contact hole exposing at least a part of the data pad portion, and at least one of the first and second contact holes may coincide with or may be smaller than the corresponding opening among the plurality of openings, and may have a tapered structure.

The thin film transistor array panel may further comprise a second field generating electrode located over the organic insulating layer, the plurality of contact holes may include a drain electrode contact hole exposing at least a part of the drain electrode, the second field generating electrode may be connected to the drain electrode through the drain electrode contact hole, and the drain electrode contact hole may have a tapered structure and may coincide with or be smaller than a corresponding one of the plurality of openings.

One of the first and second field generating electrodes may have a plate shape, and the other may have a grating shape.

The thin film transistor array panel may further include a color filter located over the data line and the drain electrode, and the organic insulating layer may be located over the color filter.

Another exemplary embodiment of the present invention provides a method for manufacturing a thin film transistor array panel, including: forming a gate line and a data line over an insulation substrate; forming an organic layer over the gate line and the data line; stacking a conductive layer over the organic layer; forming a first photosensitive film pattern over the conductive layer; forming a first field generating electrode by etching the conductive layer using the first photosensitive film pattern as a mask; deforming at least a portion of the first photosensitive film pattern to contact the organic layer; and forming an organic insulating layer including at least a contact hole by etching the organic layer using the first photosensitive film pattern as a mask.

The first photosensitive film pattern and the organic layer may make contact with each other through a hard bake process.

The temperature of the hard bake process may be equal to or higher than about 130° C.

The method may further include: forming a first passivation layer under the organic layer; forming a second passivation layer over the first field generating electrode; and forming a second field generating electrode over the second passivation layer.

The first photosensitive film pattern may have a thickness equal to or greater than that of the organic layer.

The contact hole of the organic insulating layer may coincide with or may be smaller than an opening of the first field generating electrode which overlaps the contact hole.

The organic insulating layer may include a non-photosensitive material.

The at least a contact hole may include: a first contact hole exposing at least a part of the gate pad portion and overlapping an opening of the first field generating electrode; and a second contact hole exposing at least a part of the data pad portion and overlapping another opening of the first field generating electrode, and at least one of the first and second contact holes may coincide with or may be smaller than the corresponding opening of the first field generating electrode, and may have a tapered structure.

The at least a contact hole may further include a drain electrode contact hole exposing at least a part of the drain electrode, the second field generating electrode may be connected to the drain electrode through the drain electrode contact hole, and the drain electrode contact hole may have a tapered structure.

One of the first and second field generating electrodes may have a plate shape, and the other may have a grating shape.

The thin film transistor array panel according to the exemplary embodiments of the present invention may include the self-aligned contact holes, thereby preventing the contact holes from being widened.

The cross-section of the contact holes may be formed to have a tapered structure, thereby preventing a short circuit.

DETAILED DESCRIPTION OF EMBODIMENTS

Figure 1:
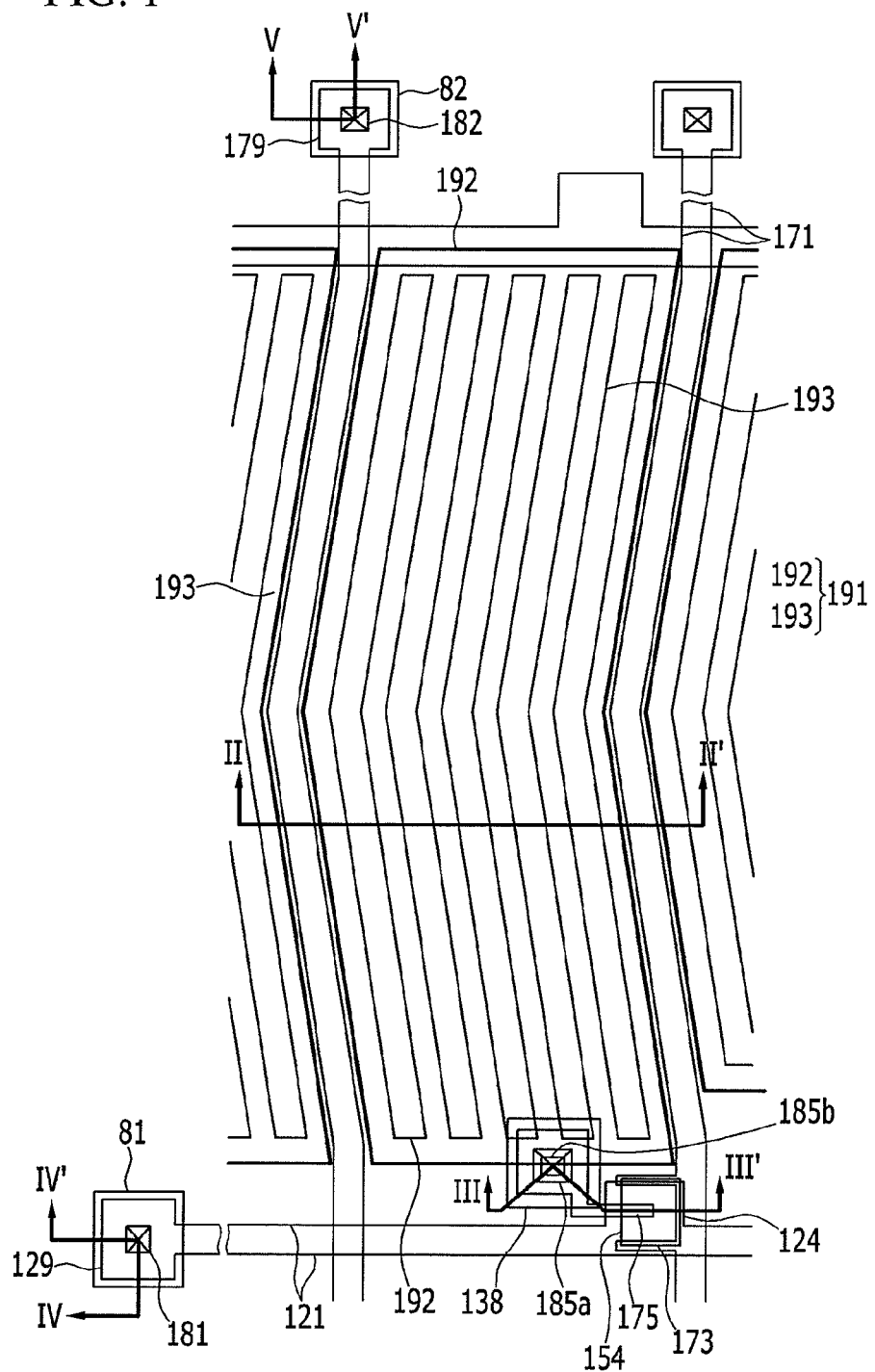
FIG. 1 is a layout view of a thin film transistor array panel according to an exemplary embodiment of the present invention.

Embodiments of the present invention are described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
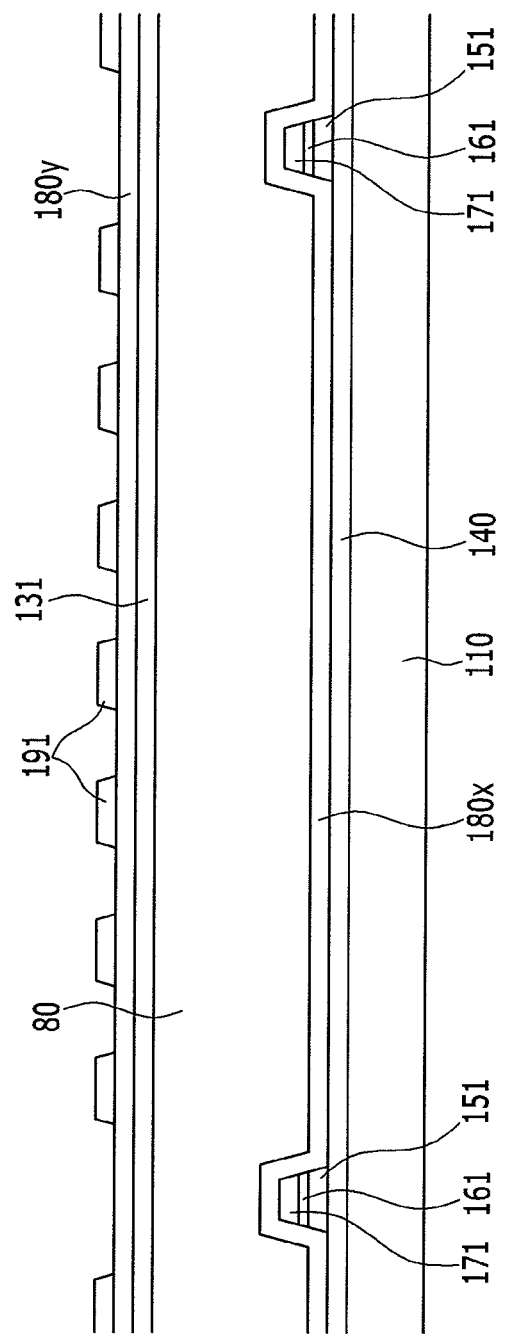
FIG. 2 is a cross-sectional view of the thin film transistor array panel of FIG. 1, taken along line II-II'.
Figure 3:
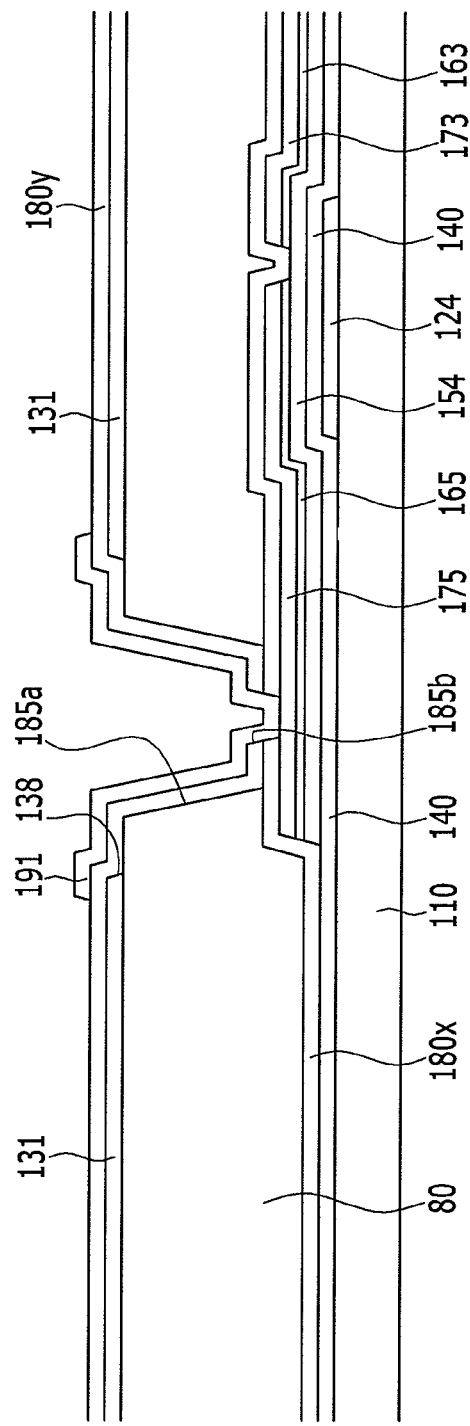
FIG. 3 is a cross-sectional view of the thin film transistor array panel of FIG. 1, taken along line III-III'.
Figure 4:
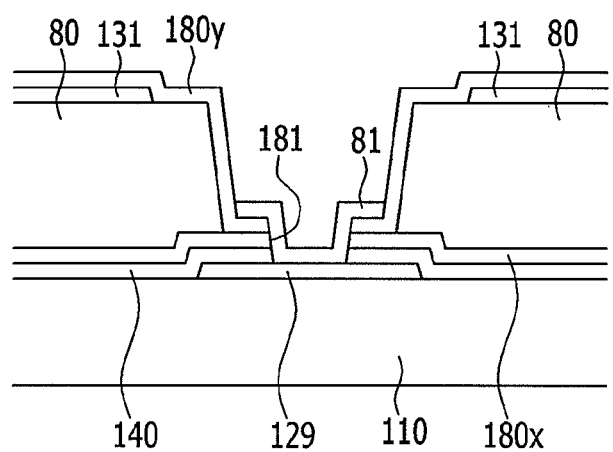
FIG. 4 is a cross-sectional view of the thin film transistor array panel of FIG. 1, taken along line IV-IV'.
Figure 5:
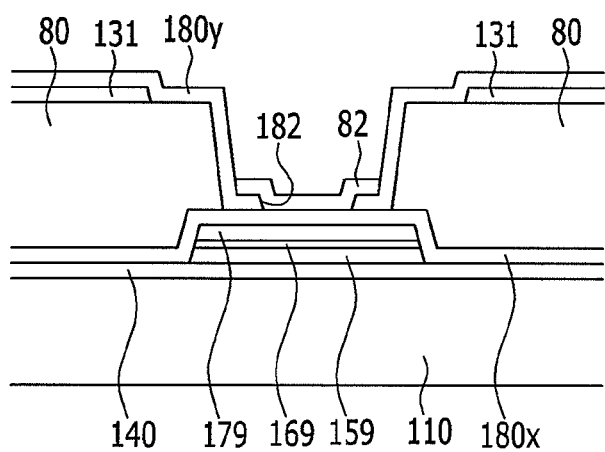
FIG. 5 is a cross-sectional view of the thin film transistor array panel of FIG. 1, taken along line V-V'.
Figure 6:
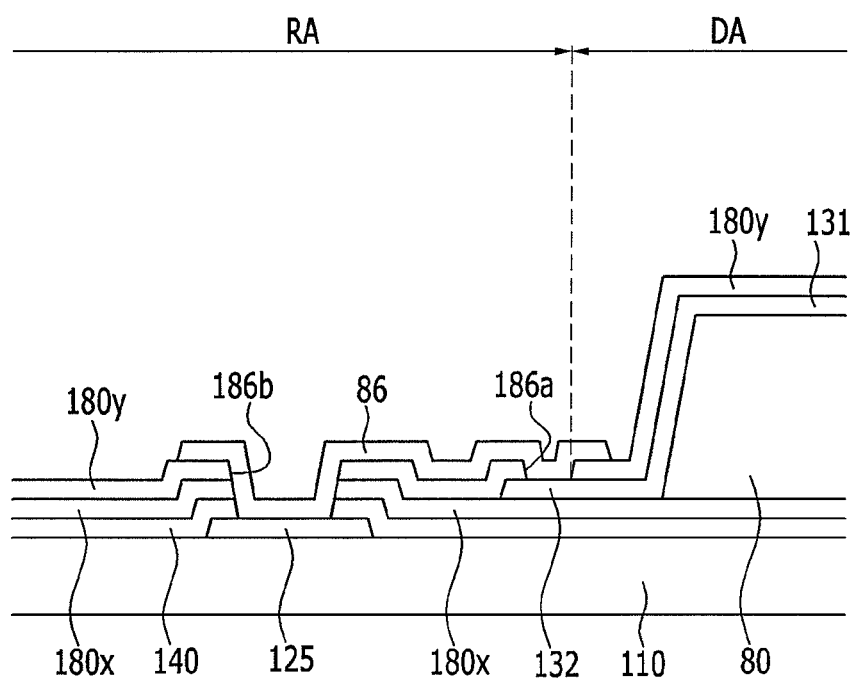
FIG. 6 is a cross-sectional view illustrating a part of a thin film transistor array panel according to another exemplary embodiment of the present invention.
Figure 7:
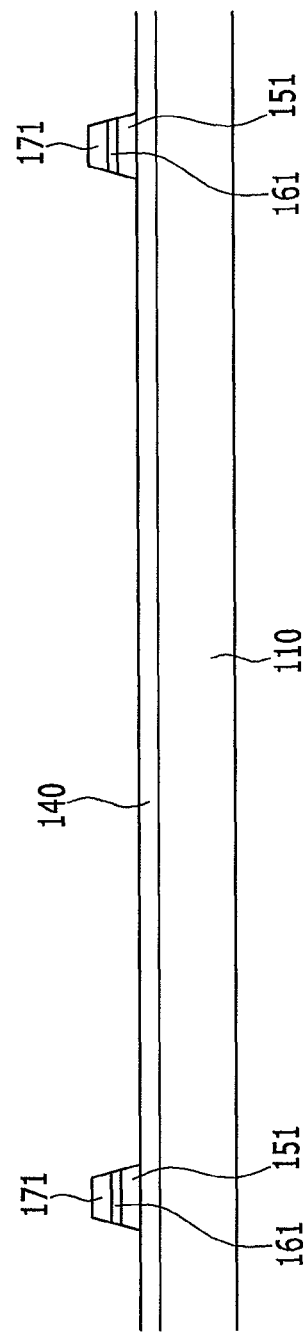
FIGS. 7 to 33 are cross-sectional views illustrating a method for manufacturing a thin film transistor array panel according to an exemplary embodiment of the present invention.
Figure 8:
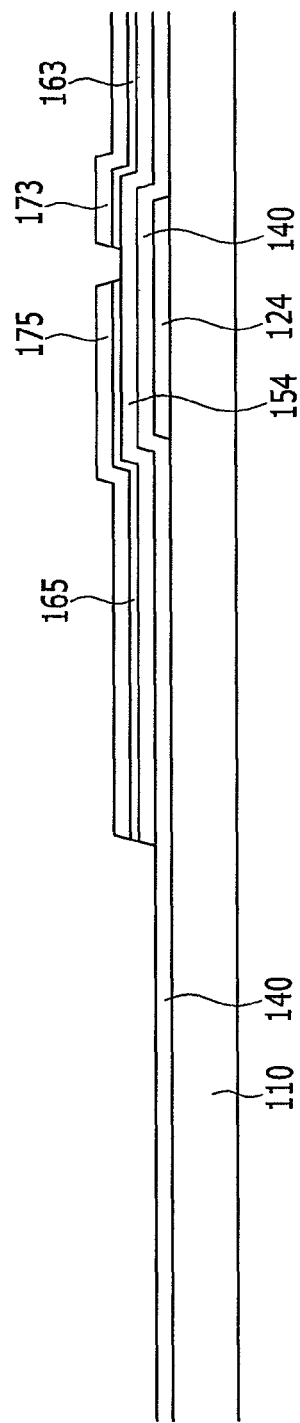
Figure 9:
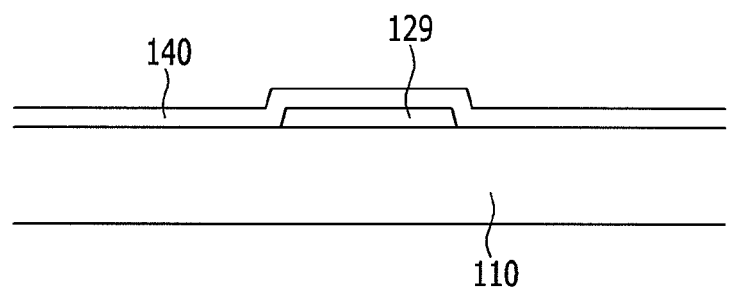
Figure 10:
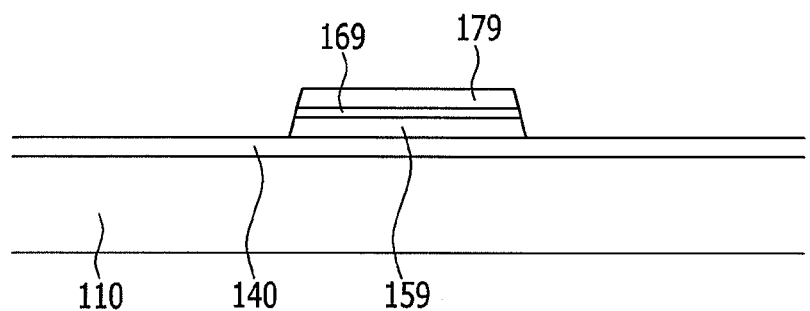
Figure 11:
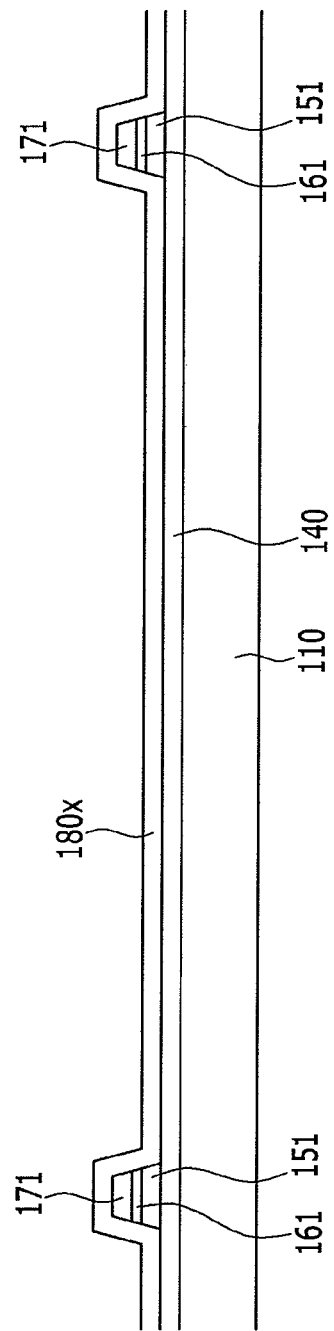
Figure 12:
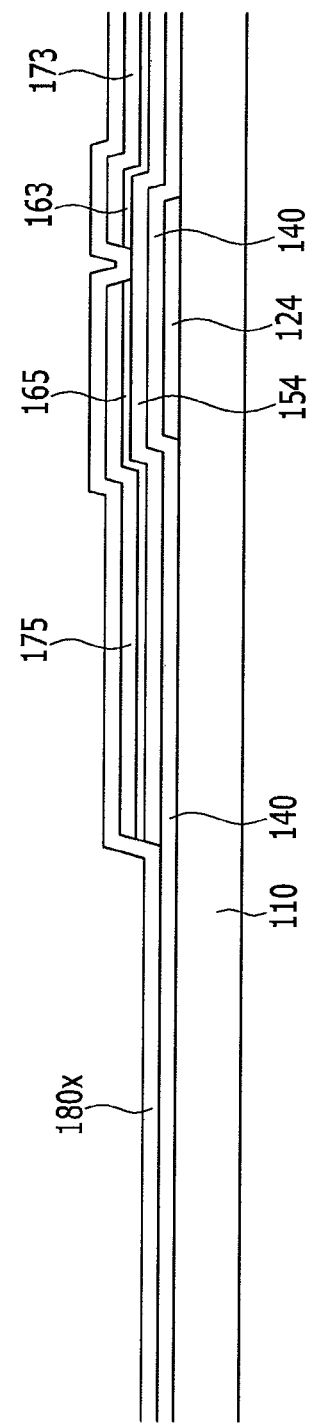
Figure 13:
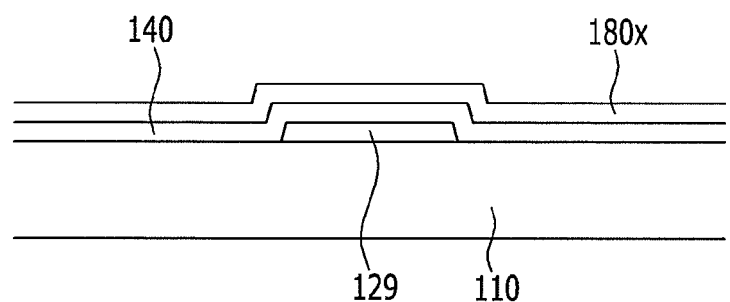
Figure 14:
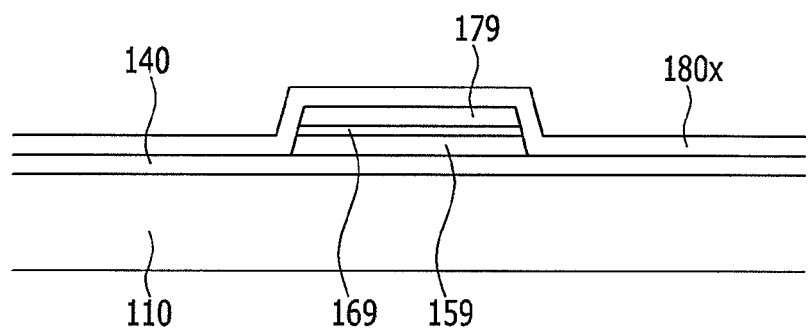
Figure 15:
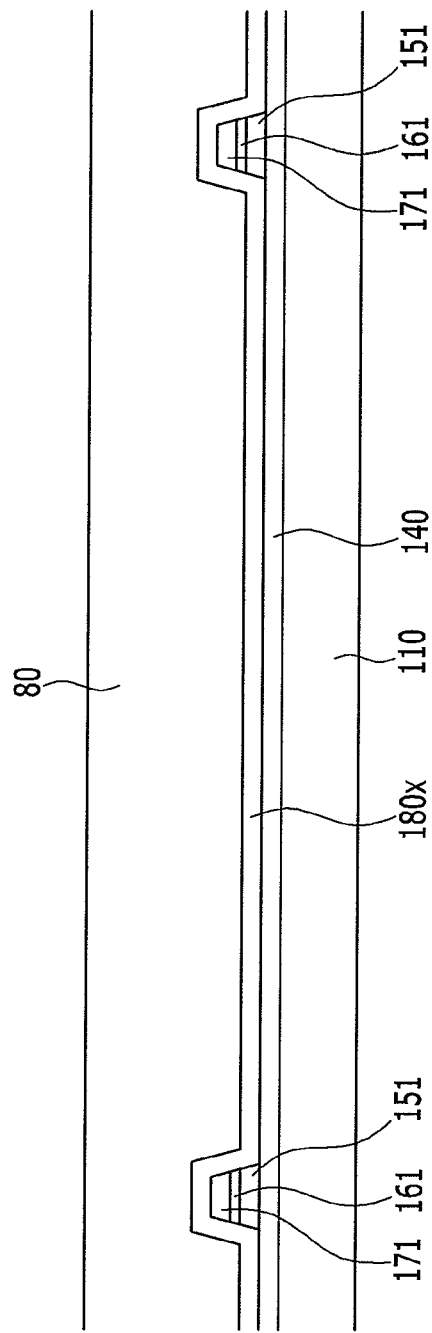
Figure 16:
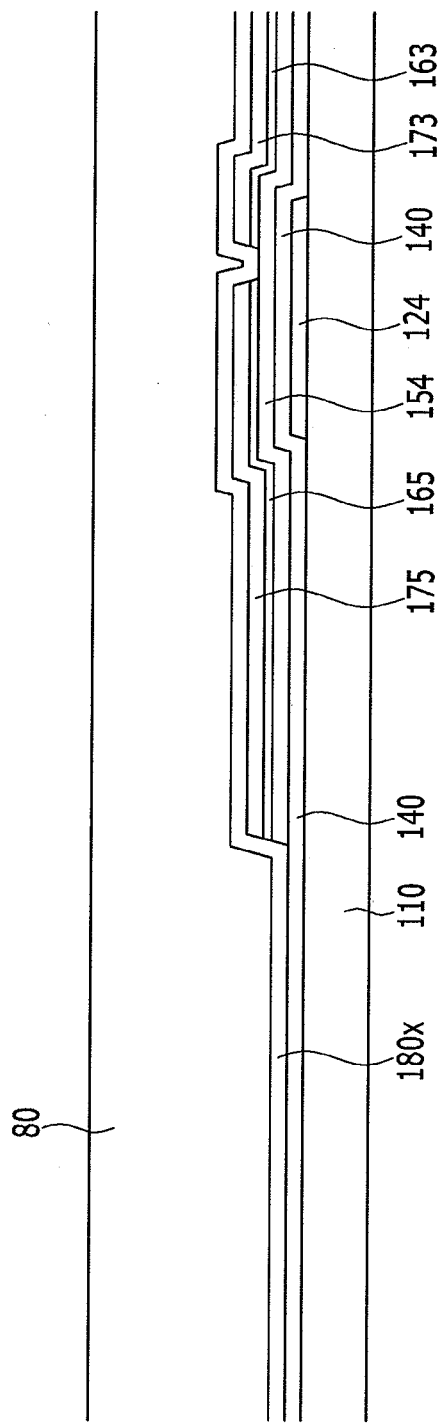
Figure 17:
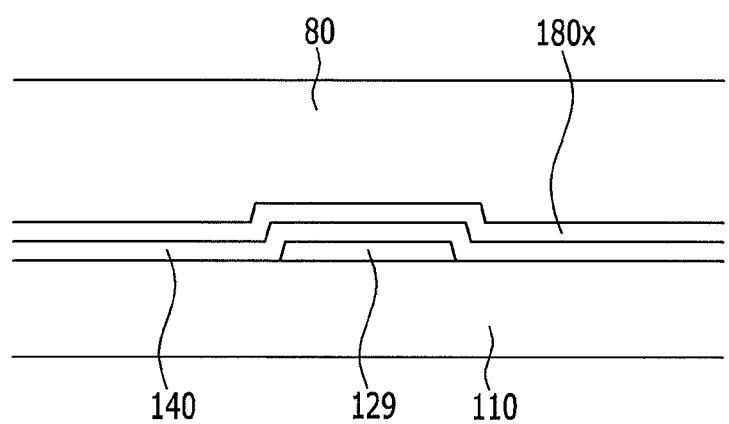
Figure 18:
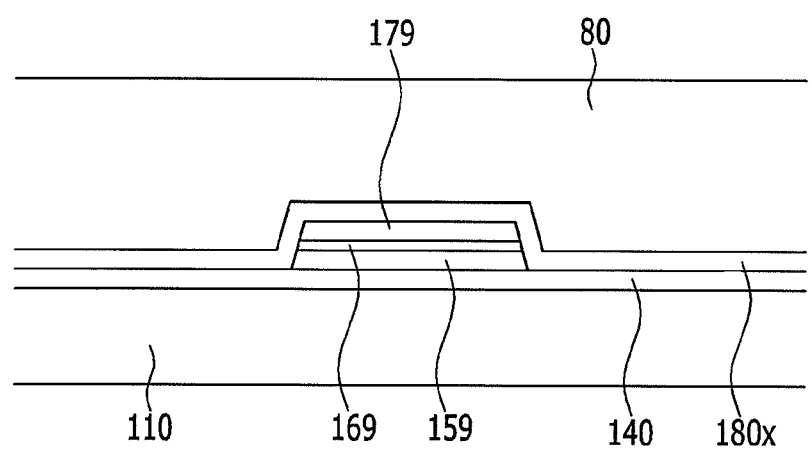
Figure 19:
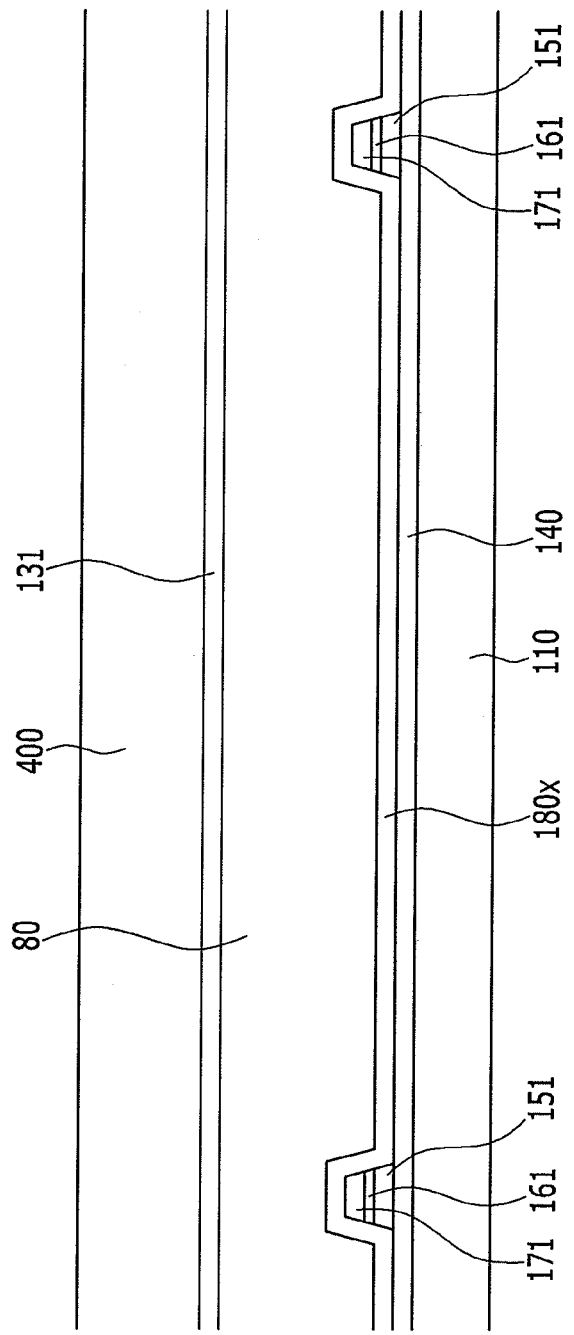

Now, a thin film transistor array panel according to an exemplary embodiment of the present invention will be described in detail with reference to FIGS. 1 to 6. FIG. 1 is a layout view of a thin film transistor array panel according to an exemplary embodiment of the present invention, FIG. 2 is a cross-sectional view of the thin film transistor array panel of FIG. 1, taken along line II-IP, FIG. 3 is a cross-sectional view of the thin film transistor array panel of FIG. 1, taken along line FIG. 4 is a cross-sectional view of the thin film transistor array panel of FIG. 1, taken along line IV-IV', FIG. 5 is a cross-sectional view of the thin film transistor array panel of FIG. 1, taken along line V-V', and FIG. 6 is a cross-sectional view illustrating a part of the thin film transistor array panel according to the exemplary embodiment of the present invention.

Referring to FIGS. 1 to 6, a plurality of gate lines 121 are formed over an insulation substrate 110.

Each of the gate lines 121 includes a plurality of gate electrodes 124 and a gate pad portion 129 having a large area for connection to another layer or external driving circuit. A gate driving circuit (not illustrated) to generate a gate signal may be mounted on a flexible printed circuit film (not illustrated) attached on the substrate 110 or directly mounted on the insulation substrate 110.

The gate line 121 may have a single-layer structure or a multilayer structure including two or more conductive layers.

A gate dielectric layer 140 is formed over the gate line 121. The gate dielectric layer 140 may be made of an inorganic insulator such as silicon nitride (SiNx) or silicon oxide (SiOx).

A plurality of semiconductors or semiconductor layers 151 are formed over the gate dielectric layer 140. Each of the semiconductors has a protrusion or raised portion 154 expanded over the gate electrode 124. The semiconductor 151 may include amorphous silicon, polysilicon, oxide semiconductor and the like. In the case of a liquid crystal display according to another exemplary embodiment of the present invention, the semiconductor 151 may be disposed only over the gate electrode 124.

The semiconductor 151 includes an end portion 159 located under a data pad portion 179.

A plurality of ohmic contacts 161, 163, 165, and 169 are formed over the semiconductors 151. The ohmic contacts 163 and 165 include portions disposed over the protrusion 154 of the semiconductor 151, while being spaced from each other around the gate electrode 124. The ohmic contact 169 is located under the data pad portion 179 to be described below.

The ohmic contacts 161, 163, 165, and 169 may be made of n+ hydrogenated amorphous silicon highly doped with n-type impurities such as phosphorous or made of silicide. However, in the case of a liquid crystal display according to another exemplary embodiment of the present invention, the ohmic contacts 161, 163, 165, and 169 may be omitted. For example, when the semiconductor 151 is an oxide semiconductor, the ohmic contacts 161, 163, 165, and 169 may be omitted.

Data conductors including a plurality of data lines 171 and a plurality of drain electrodes 175 are formed over the ohmic contacts 161, 163, 165, and 169.

The data line 171 serves to transfer a data signal, and extends in a direction so as to cross the gate line 121. Each of the data lines 171 includes a plurality of source electrodes 173 extending toward the gate electrode 124 and a data pad portion 179 having a large area for connection to another layer or external driving circuit. A data driving circuit (not illustrated) to generate a data signal may be mounted on a flexible printed circuit film (not illustrated) attached on the substrate 110 or directly mounted on the substrate 110.

The data line 171 is periodically bent, and forms an oblique angle with the extension direction of the gate line 121. The angle between the data line 171 and the extension direction of the gate line 121 may be equal to or greater than about 45 degrees. In the case of a thin film transistor array panel according to another exemplary embodiment of the present invention, the data line 171 may be extended in a straight line.

A drain electrode 175 includes a bar-shaped end portion spaced from the source electrode 173 around the gate electrode 124 and another end portion having a large area.

The data conductors 171 and 175 may have a single-layer structure or a multilayer structure including two or more conductive sub-layers.

The gate electrode 124, the source electrode 173, the drain electrode 175, and the semiconductor portion 154 constitute a thin film transistor (TFT) serving as a switching element. Except for the protrusion 154 of the semiconductor 151 where the TFT is located, the semiconductor 151 may have almost the same shape as the data line 171, the drain electrode 175, and the ohmic contacts 161, 165, and 169 thereunder.

A first passivation layer 180x is formed over the data line 171, the drain electrode 175, and the protrusion 154 of the exposed semiconductor 151. The first passivation layer 180x may be made of an inorganic insulator such as SiNx or SiOx.

An organic insulating layer 80 is located over the first passivation layer 180x. The organic insulating layer 80 may have a flat surface as a whole. The organic insulating layer 80 includes a photosensitive material and a non-photosensitive material.

The organic insulating layer 80 includes a plurality of contact holes, each of which is located at a position 185a at which it can make contact with one of the gate pad portion 129, the data pad portion 179, and the drain electrode.

During the manufacturing process, in one embodiment, portions of the organic insulating layer 80 are removed at regions corresponding to the gate pad portion 129 and the data pad portion 179. During this process, the organic insulating layer 80 is first applied the entire area even onto the gate pad portion 129 and the data pad portion 179, but etched to form a first contact hole 181, a second contact hole 182 and the like.

In embodiments, the contact holes including the first contact hole 181, the second contact hole 182, the drain electrode contact hole and the like are self-aligned to coincide with openings 138 of a first field generating electrode to be described below, and form a tapered structure to prevent a short or increase of resistance. In embodiments, as shown in FIGS. 3-5, the tapered structure has a first diameter of the contact hole at its upper end and a second diameter of the contact hole at its bottom end. The first diameter is greater than the second diameter. For the structure of the self-aligned structure, the contact holes may be formed to have a reduced size.

When the contact hole formed in the plurality of insulating layers has a reverse-tapered structure, it is possible that the field generating electrode formed thereon is shorted within the contact hole. Thus, to avoid or minimize the short circuit possibility, contact hole is formed in such a manner that the cross-section thereof has a tapered structure as shown in FIGS. 3-5.

The contact hole 185a of the organic insulating layer 80 is formed to expose an area in which a drain electrode contact hole 185b for physical and electrical connection to the drain electrode 175 and a pixel electrode 191 is to be formed. The organic insulating layer 80 is applied onto the entire surface of the resultant structure, and etched at a region where the drain electrode contact hole 185b is formed.

Although not illustrated, a thin film transistor array panel according to another exemplary embodiment of the present invention may include a color filter located under the organic insulating layer 80. In this case, the thin film transistor array panel may further include a layer disposed over the organic insulating layer 80. For example, the thin film transistor array panel may further include a capping layer disposed over the color filter so as to prevent pigment of the color filter from being introduced into the liquid crystal layer, and the capping layer may be made of an insulator such as SiNx.

A first electric field generating electrode 131 is formed over the organic insulating layer 80. The first field generating electrode 131 may be made of a transparent conductive material such as ITO or IZO. In the present exemplary embodiment, the first field generating electrode 131 may have a plate shape.

As shown in FIG. 3, the edge of the opening 138 of the first field generating electrode 131 may be spaced from an upper edge of the contact hole 185a so that the diameter of the opening 138 is greater than the first diameter of the contact hole 185a. In alternative embodiments, the opening may coincide with the contact hole. In other words, the top edge of the contact hole of the organic insulating layer 80 may coincide with the edge of the opening of the first field generating electrode 131. As such, the contact hole is totally eclipsed by the opening when viewed in a viewing direction perpendicular to the major surface of the substrate 110.

The first field generating electrode 131 is connected to a common voltage line 125 located at a peripheral area around a display region through a plurality of fourth and fifth contact holes 186a and 186b to be described below with reference to FIG. 6, and receives a common voltage.

The first field generating electrode 131 has an opening 138 formed at a region corresponding to the drain electrode 175.

A second passivation layer 180y is formed over the first field generating electrode 131 and a part of the first passivation layer 180x. The second passivation layer 180y may be made of an inorganic insulator such as SiNx or SiOx.

A second electric field generating electrode 191 is formed over the second passivation layer 180y. The second field generating electrode 191 may be made of a transparent conductive material such as ITO or IZO.

The second field generating electrode 191 includes a plurality of branch electrodes 193 extending in parallel to each other as a whole and separated from each other and lower and upper horizontal portions 192 connecting upper and lower end portions of the branch electrodes 193. Thus, the second field generating electrode 191 has a grating shape. In embodiments, the branch electrodes 193 of the second field generating electrode 191 may be bent along the data line 171. However, in the case of a thin film transistor array panel according to another exemplary embodiment of the present invention, the data line 171 and the branch electrodes 193 of the second field generating electrode 191 may be extended in a straight line.

The first passivation layer 180x, the second passivation layer 180y, and the gate dielectric layer 140 have one or more first contact holes 181 formed to expose a part of the gate pad portion 129. The first contact hole 181 may be formed in a polygonal shape such as a rectangle or a circular or elliptical shape. The first contact hole 181 has a first connecting member 81 formed therein. The first connecting member 81 is formed as the same layer as the second field generating electrode 191.

The first passivation layer 180x and the second passivation layer 180y have one or more second contact holes 182 formed therein, the second contact hole 182 exposing a part of the data pad portion 179. The second contact hole 182 may be formed in a polygonal shape such as a rectangle or a circular or elliptical shape. The second contact hole 182 has a second connecting member 82 formed therein. The second connecting member 82 is formed as the same layer as the second field generating electrode 191.

The first passivation layer 180x and the second passivation layer 180y have a drain electrode contact hole 185b formed therein, the drain electrode contact hole 185b exposing a part of the drain electrode 175. The drain electrode contact hole 185b is located within a region surrounded by the first contact hole 185a of the organic insulating layer 80 and the opening 138 of the first field generating electrode 131, and may be self-aligned.

Referring to FIG. 6, the common voltage line 125 is formed over the insulation substrate 110. The common voltage line 125 is disposed in a peripheral area RA around a display area DA where a plurality of pixels are located. The common voltage line 125 may transfer a predetermined voltage such as a common voltage Vcom and may be located in at least a part of the peripheral area RA. The organic insulating layer 80 is not located in the peripheral area RA.

The end portion 132 of the first field generating electrode 131 formed in the peripheral area RA is exposed through the fourth contact hole 186a formed in the second passivation layer 180y, and the common voltage line 125 is exposed through the fifth contact hole 186b formed in the gate dielectric layer 140, the first passivation layer 180x, and the second passivation layer 180y. A third connecting memory 86 is formed over the end portion 132 of the first field generating electrode 131 and a part of the common voltage line 125, which are exposed through the fourth contact hole 186a and the fifth contact hole 186b, respectively. Thus, the first field generating electrode 131 is connected to the common voltage line 125 located in the peripheral area around the display area through the fourth and fifth contact holes 186a and 186b, and receives a common voltage.

The first field generating electrode 131 is connected to the common voltage line 125 through the fourth and fifth contact holes 186a and 186b, and receives a common voltage. The second field generating electrode 191 is connected to the drain electrode 175 through the drain electrode contact hole 185b, and receives a data voltage.

The first and second field generating electrodes 131 and 191 receiving the common voltage and the data voltage, respectively, generate an electric field in the liquid crystal layer (not illustrated).

In the thin film transistor array panel according to the exemplary embodiment of the present invention, the plate-shaped first field generating electrode 131 is disposed under the second passivation layer 180y, and the second field generating electrode 191 having branch electrodes is disposed over the second passivation layer 180y. However, in a thin film transistor array panel according to another exemplary embodiment of the present invention, the second field generating electrode 191 having branch electrodes may be disposed under the second passivation layer 180y, and the plate-shaped first field generating electrode 131 may be disposed over the second passivation layer 180y. Any one of the first and second field generating electrodes 131 and 191 may include branch electrodes, and the other one may be formed in a plate shape. Furthermore, any one of the first and second field generating electrodes 131 and 191 may receive a common voltage, and the other one may receive a data voltage.

Then, referring to FIGS. 7 to 33, a method for manufacturing a thin film transistor array panel according to an exemplary embodiment of the present invention will be described. FIGS. 7 to 33 are cross-sectional views illustrating the method for manufacturing a thin film transistor array panel according to the exemplary embodiment of the present invention.

As illustrated in FIGS. 7 to 10, a gate line 121 including a gate electrode 124 and a gate pad portion 129 is formed over an insulation substrate 110. At this time, a common voltage line may be simultaneously formed to be disposed in a peripheral area. Then, a gate dielectric layer 140 is stacked over the gate line 121 and the common voltage line, a semiconductor 151 is stacked, and a layer forming ohmic contacts is formed. A data conductor including a data line 171 and a drain electrode 175 is formed, the data line 171 including a source electrode 173 and a data pad portion 179. Then, the data conductor is used as a mask to etch the layer forming ohmic contacts, thereby completing ohmic contacts 161, 163, 165, and 169 and exposing a part of a protrusion 154 of the semiconductor 151. The gate dielectric layer 140 may be made of an inorganic insulator such as SiNx or SiOx.

Referring to FIGS. 11 to 14, a first passivation layer 180x is stacked over the data conductors 171 and 175. The first passivation layer 180x may be made of an inorganic insulator such as SiNx or SiOx.

Then, as illustrated in FIGS. 15 to 18, an organic layer is formed over the first passivation layer 180x. The organic layer may include a photosensitive material and a non-photosensitive material, and may have a flat surface as a whole. The organic layer is located even in a region corresponding to the gate pad portion 129 and the data pad portion 179.

According to another exemplary embodiment of the present invention, a color filter may be located under the organic layer. In this case, a capping layer may be further formed over the organic layer.

Referring to FIGS. 19 to 22, a conductive layer is stacked over the organic layer so as to form a first field generating electrode 131 including an opening located at a position corresponding to the drain electrode 175. The first field generating electrode 131 may have a plane shape, for example.

Figure 20:
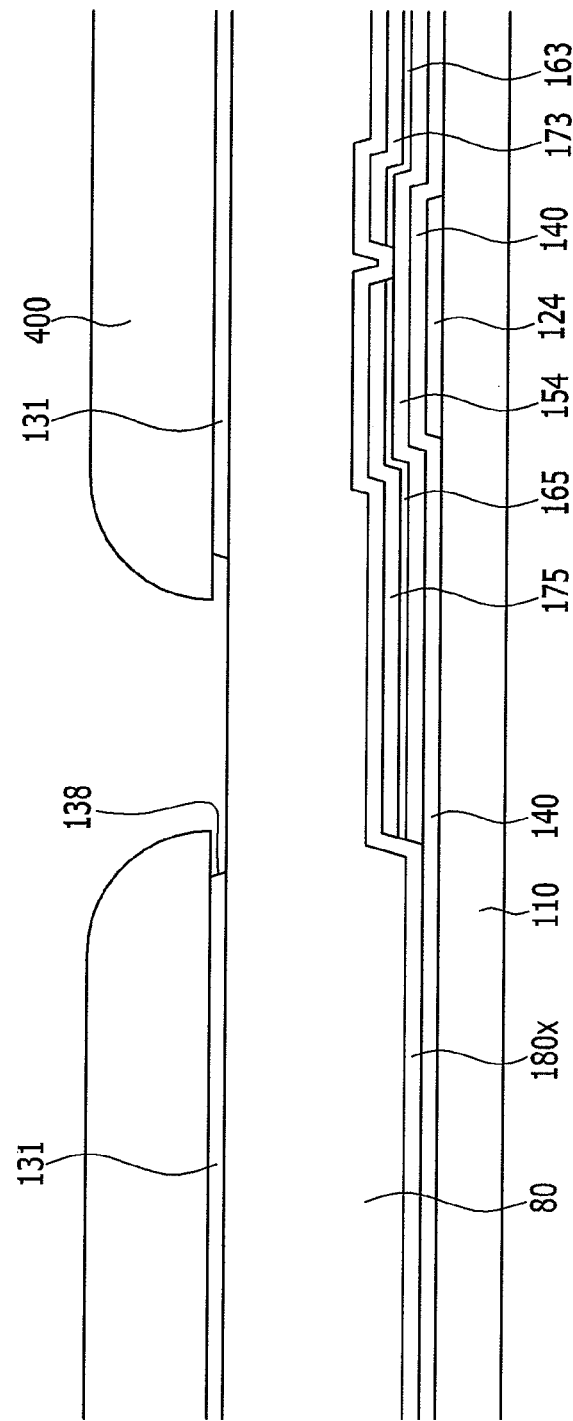
Figure 21:
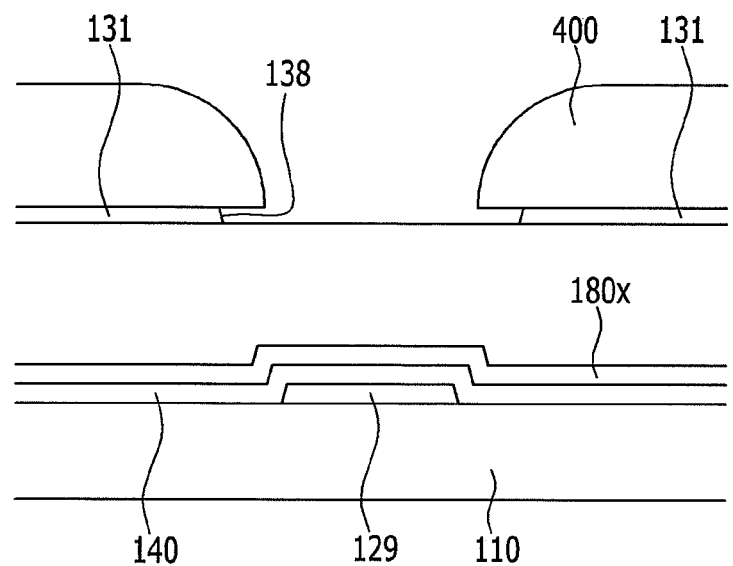
Figure 22:
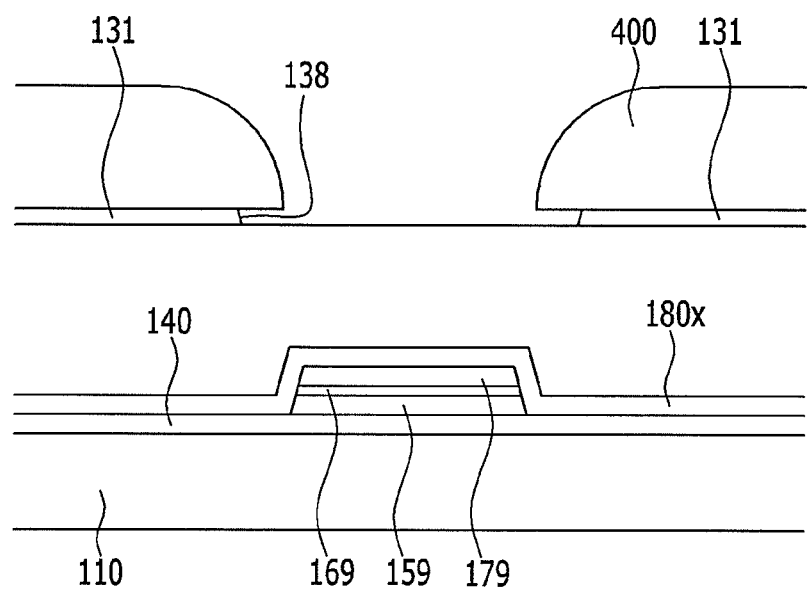

The first field generating electrode 131 is formed through the following process: a first photosensitive film pattern 400 is first formed over the conductive layer and then used as a mask to etch or pattern the conductive layer applied onto the organic layer to form the opening 138. In embodiments, the first photosensitive film pattern 400 may have the same thickness as or a greater thickness than the organic layer. As shown in FIGS. 20-22, the diameter of the opening 138 is formed to be greater than that of an opening of the first photosensitive film pattern 400.

Figure 23:
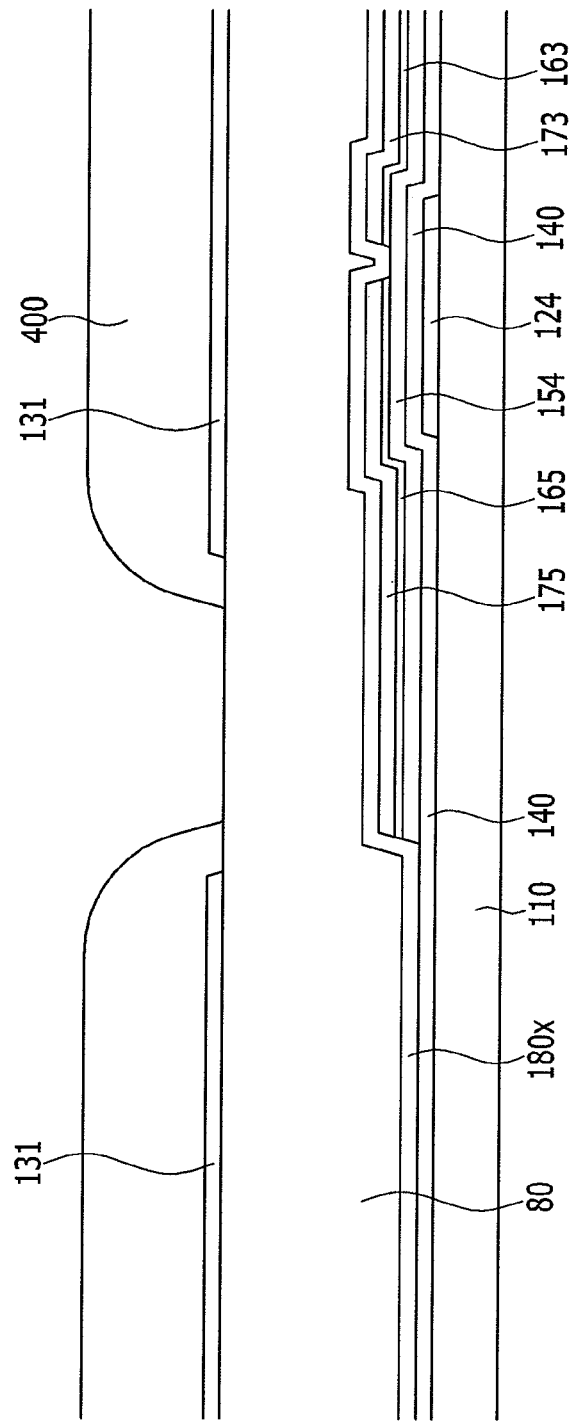
Figure 24:
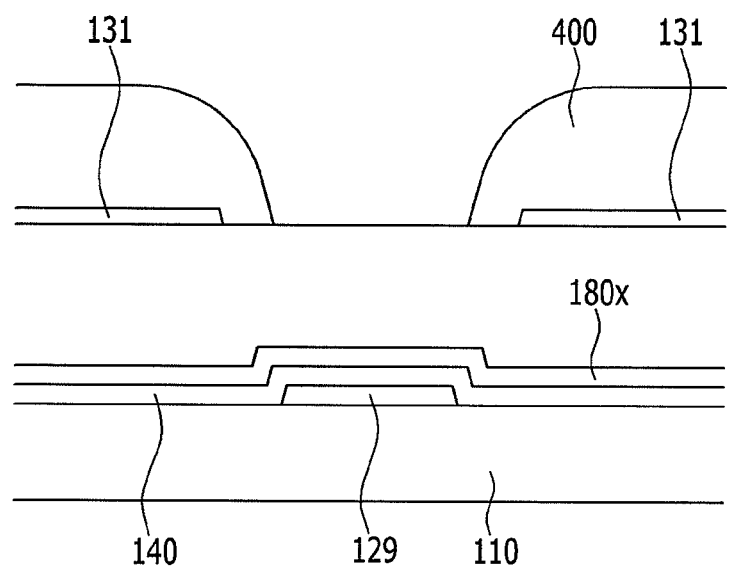
Figure 25:
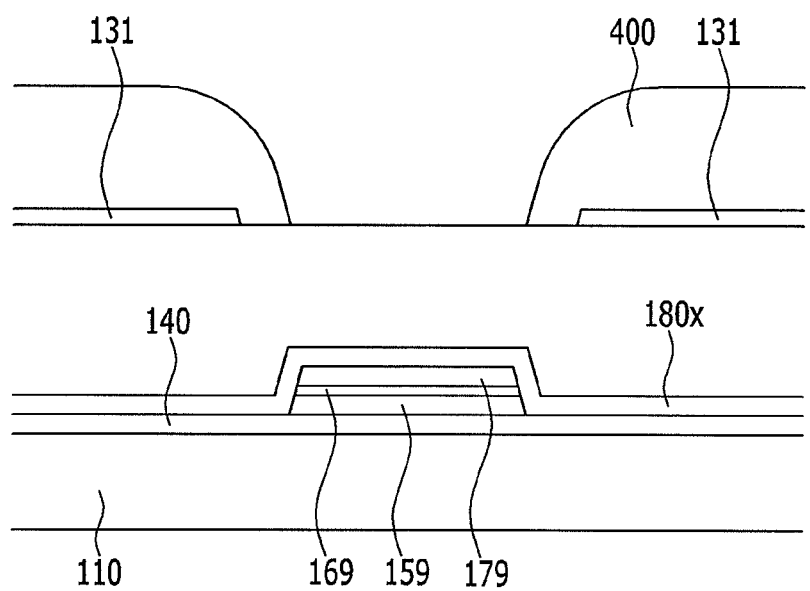
Figure 26:
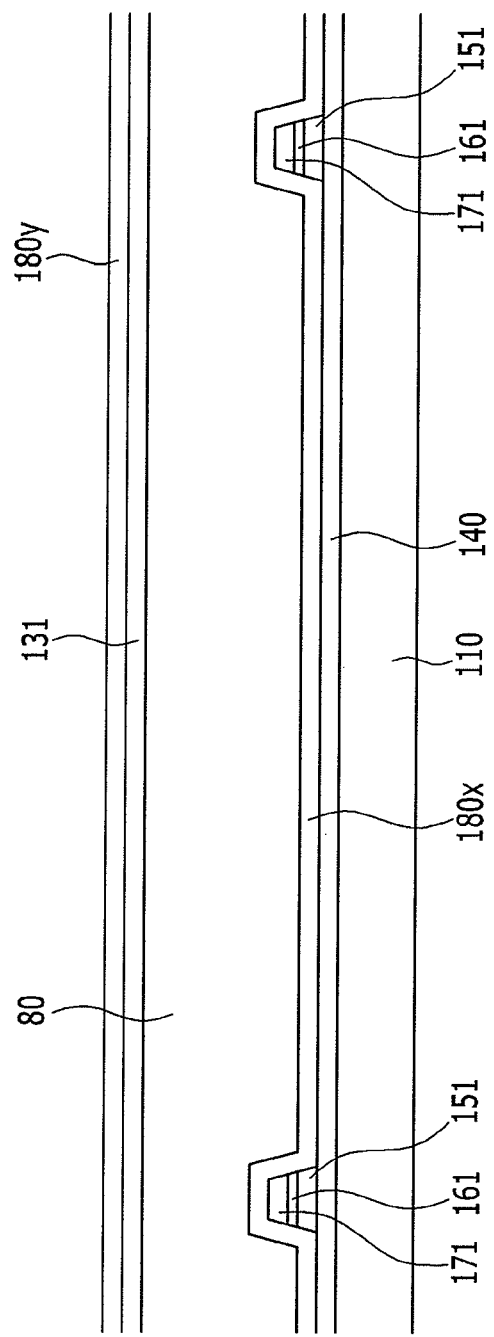
Figure 27:
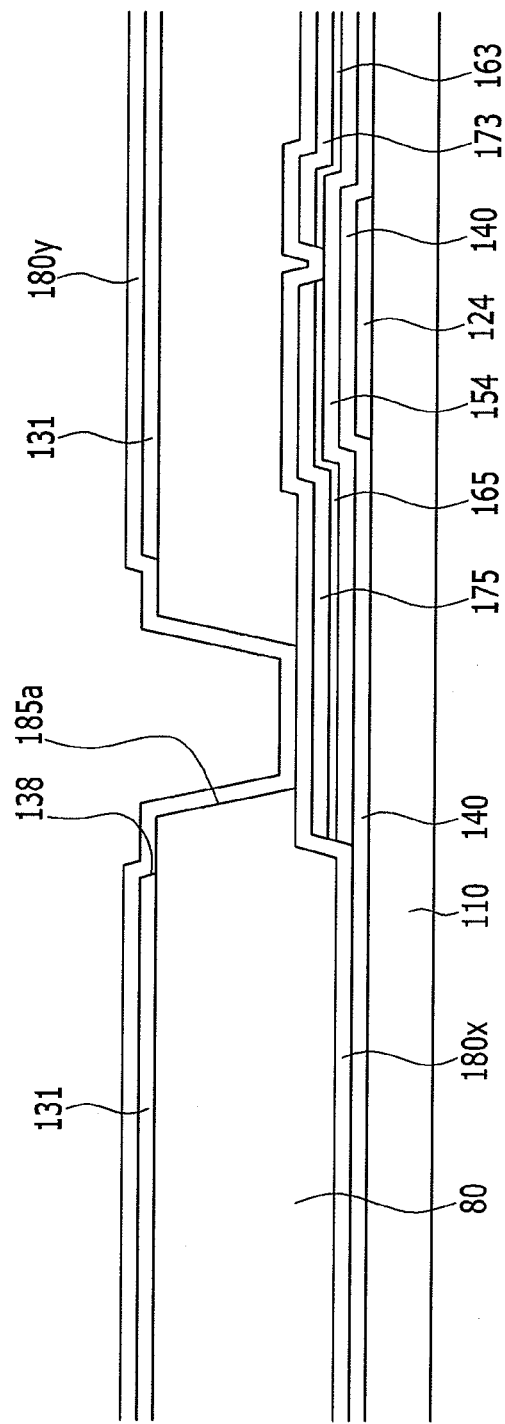
Figure 28:
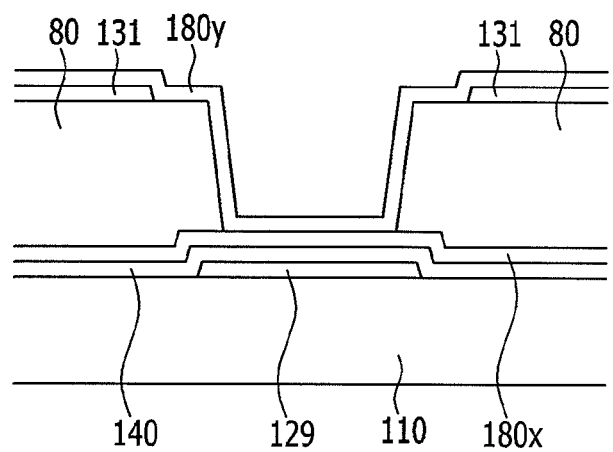
Figure 29:
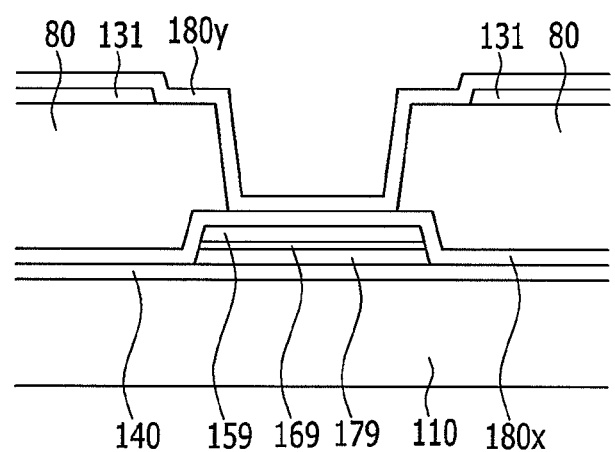
Figure 30:
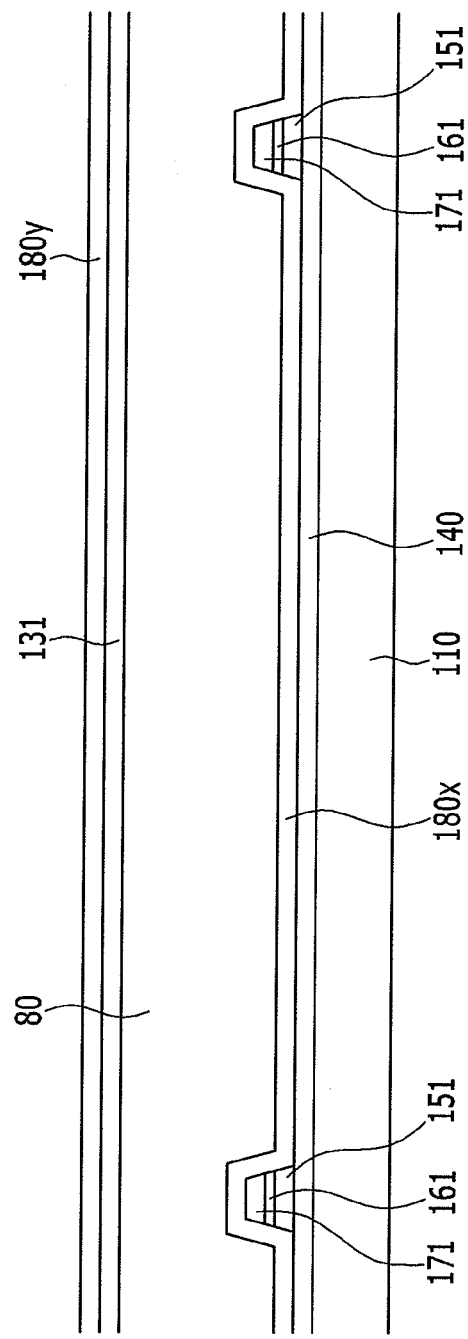
Figure 31:
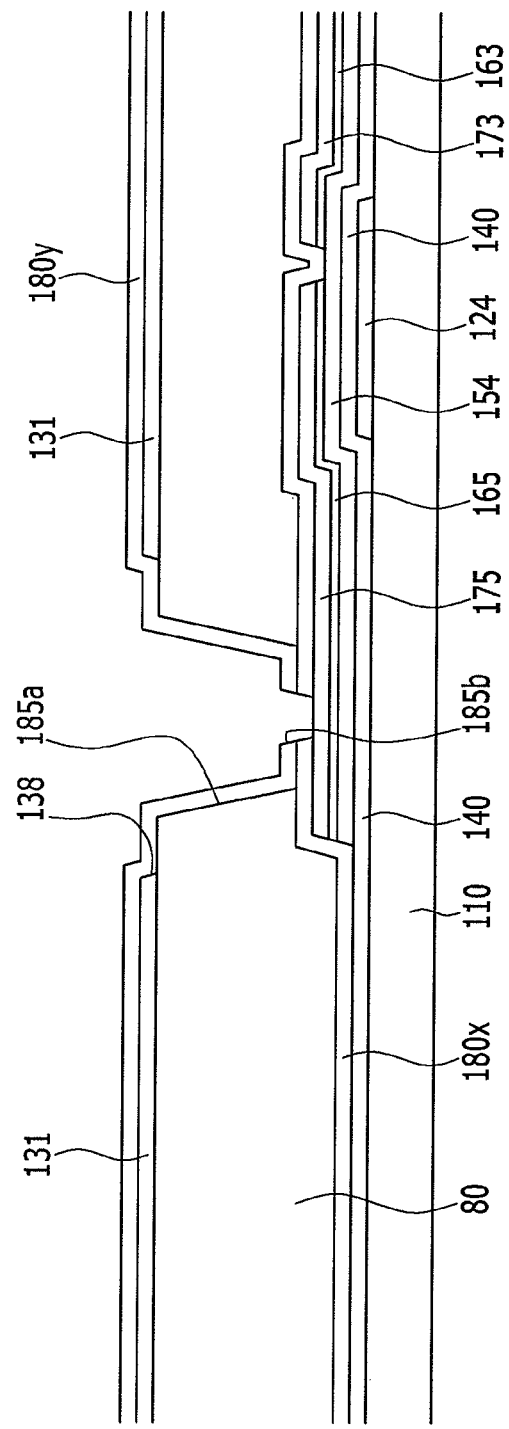
Figure 32:
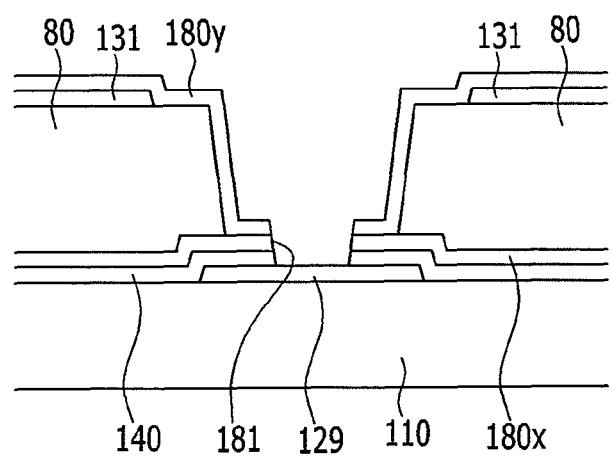
Figure 33:
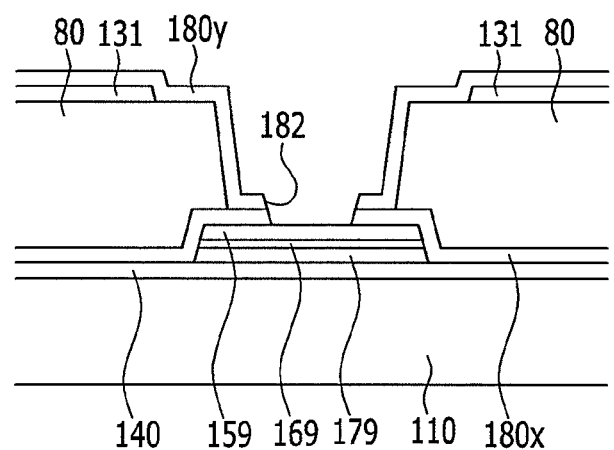

Referring to FIGS. 23 to 25, subsequently to forming the opening, the first photosensitive film pattern 400 is at least partly deformed to make contact with the organic layer located under the opening of the first field generating electrode 131. For this structure, the edge of the opening of the first field generating electrode 131 is retracted and spaced from the edge of the first photosensitive film pattern 400. In this configuration, the first photosensitive film pattern 400 and the organic layer easily contact each other, which makes it possible to facilitate the contact process.

Any processes for making contact between the first photosensitive film pattern 400 and the organic layer may be used. In embodiments, a hard bake process is used to make contact between the first photosensitive film pattern 400 and the organic layer. At this time, the process temperature of the hard bake process is equal to or more than about 130° C.

In embodiments, after making contact between the first photosensitive film pattern 400 and the organic layer, the edge of the opening 138 is covered by the first photosensitive film pattern 400. Any region of the first field generating electrode 131 is not exposed. Subsequent to making contact between the first photosensitive film pattern 400 and the organic layer, the organic layer is etched and a tapered structure of the contact hole may be formed.

When the organic layer is etched, the contacted first photosensitive film 400 is used as a mask to perform a dry etch process. At this time, the organic layer and the first photosensitive film pattern 400 are etched together.

This process includes a fluorine-based gas based on $O_2$. The fluorine-based gas includes $C_2F_6$, $CF_4$, $C_3F_8$, $SF_6$, $NF_3$ and the like, and the etched organic layer forms the organic insulating layer 80 including a drain electrode contact hole and the like.

According to the exemplary embodiment of the present invention, the organic insulating layer 80 and the first field generating electrode 131 are etched by the same photosensitive film pattern through the process of making contact between the first photosensitive film pattern 400 and the organic layer, and thus a self-aligned structure is formed. Through the contact structure, it is possible to prevent the organic layer from being etched into a reverse-tapered structure, thereby preventing a short.

According to the exemplary embodiment of the present invention, the first photosensitive film pattern 400 is used to form the first field generating electrode 131 and the organic insulating layer 80. Thus, since the self-aligned contact holes are formed, it is possible to prevent the contact holes from being widened.

Referring to FIGS. 26 to 29, a second passivation layer 180y is formed over the first field generating electrode.

Then, as illustrated in FIGS. 30 to 33, the second passivation layer 180y, the first passivation layer 180x, and the gate dielectric layer 140 are sequentially etched to form a first contact hole 181 exposing a part of the gate pad portion 129, a second contact hole 182 exposing a part of the data pad portion 179, and a drain electrode contact hole 185b exposing a part of the drain electrode 175. At this time, as illustrated in FIG. 6, a fourth contact hole 186a is formed in the second passivation layer 180y so as to expose an end portion 132 of the first field generating electrode 131 formed in the peripheral area RA, and a fifth contact hole 186b is formed in the gate dielectric layer 140, the first passivation layer 180x, and the second passivation layer 180y so as to expose a part of the common voltage line 125.

Finally, as illustrated in FIGS. 1 to 6, a second field generating electrode 191, a first connecting member 81, a second connecting member 82, and a third connecting member 86 are formed over the second passivation layer 180y.

The first connecting member 81 covers the gate pad portion 129 exposed through the first contact hole 181, and the second connecting member 82 covers the data pad portion 179 exposed through the second contact hole 182.

The second field generating electrode 191 covers the drain electrode 175 exposed through the drain electrode contact hole 185b and is physically and electrically connected to the drain electrode 175.

The third connecting member 86 covers the end portion 132 of the first field generating electrode 131 exposed through the fourth contact hole 186a and the common voltage line 125 exposed through the fifth contact hole 186b, and electrically connects the first field generating electrode 131 and the common voltage line 125.

Figure 34:
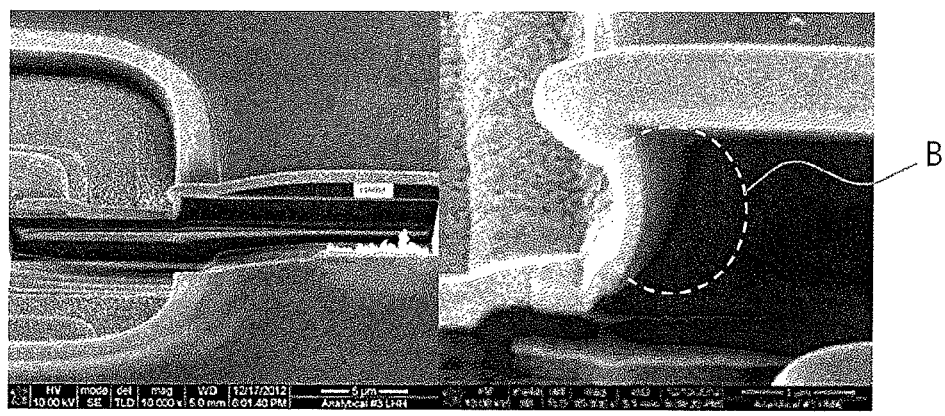
FIGS. 34 and 35 are electron microscope photographs showing the cross-sections of a thin film transistor array panel according to a comparative example of the present invention and the thin film transistor array panel according to the exemplary embodiment of the present invention.

The cross-section of the thin film transistor array panel according to the exemplary embodiment of the present invention was observed, and a proper process temperature was tested to form the cross-section. FIG. 34 is an electron microscope photograph showing the cross-section of a thin film transistor array panel according to a comparative example of the present invention, FIG. 35 is an electron microscope photograph showing the cross-section of the thin film transistor array panel according to the exemplary embodiment of the present invention, and FIGS. 36A to 36E show results of a contact process temperature measurement test according to the exemplary embodiment of the present invention.

Referring to FIG. 34, since the comparative example does not include a contact process unlike the exemplary embodiment of the present invention, the organic layer is considerably etched toward the inside as indicated by a symbol B. Thus, a reverse-tapered structure may be formed. When such an etching process is performed considerably, a short is likely to occur.

Figure 35:
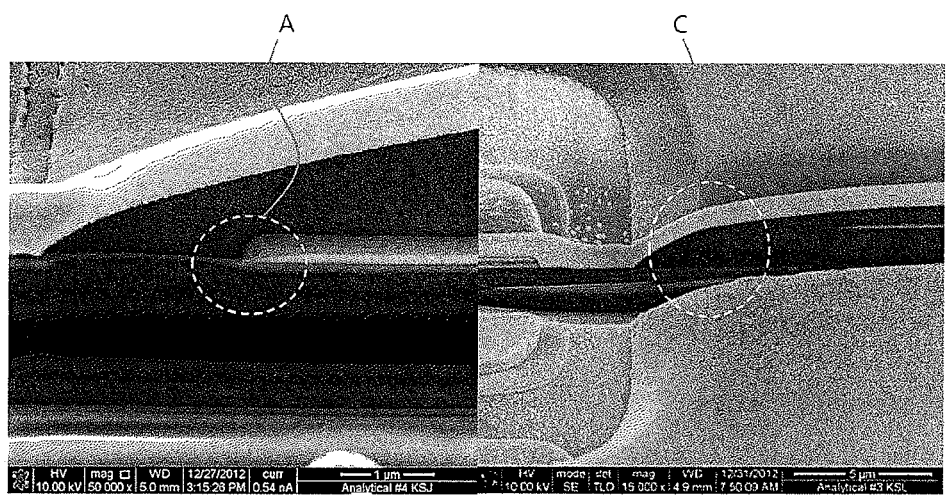
Figure 36A:
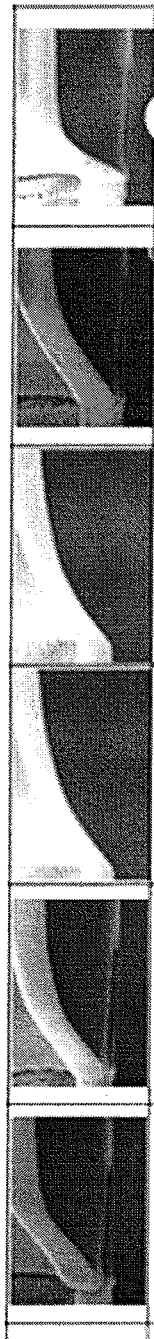
FIGS. 36A to 36E show results of a contact process temperature measurement test according to the exemplary embodiment of the present invention.
Figure 36B:
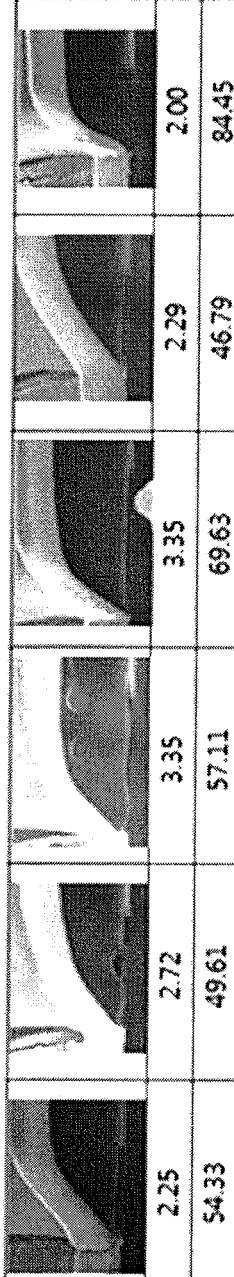
Figure 36C:
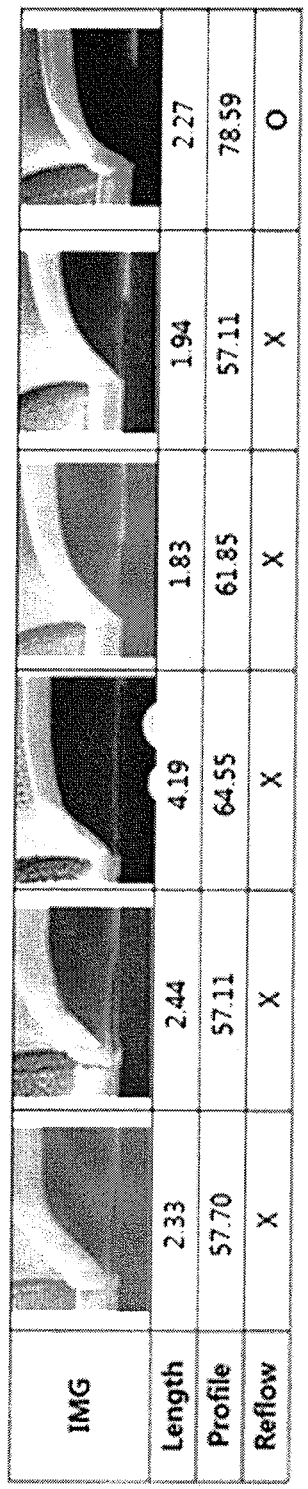
Figure 36D:
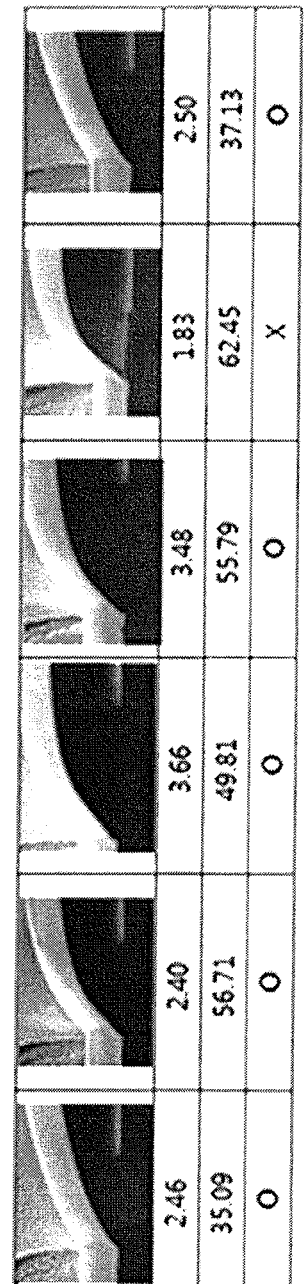
Figure 36E:

On the other hand, according to the exemplary embodiment of the present invention, the organic layer may be etched through the contact by the hard bake process so as to have a tapered structure as indicated by symbols A and C of FIG. 35.

Referring to FIGS. 36A to 36E, the range of a proper temperature of the hard bake process was tested. Specifically, whether a subsequent reflow process of a photosensitive film pattern may be performed at a temperature of (a) 110° C., (b) 115° C., (c) 120° C., (d) 125° C. or (e) 130° C. was tested.

According to the test results, the reflow process cannot be performed in the range of 110 to 125° C. corresponding to FIGS. 36A to 36D, but the photosensitive film pattern by the hard bake process performed at a temperature of 130° C. may be subjected to the reflow process. Thus, according to the exemplary embodiment of the present invention, the hard bake process may be performed at a temperature of about 130° C. or more, but the temperature may be changed depending on the material of the photosensitive film pattern.

All features of the thin film transistor array panel according to the exemplary embodiment of the present invention may be applied to all cases in which two field generating electrodes, that is, a common electrode and a pixel electrode are disposed over the thin film transistor array panel.

While embodiments of the invention have been described, it is to be understood that the invention is not limited to the disclosed embodiments, but, on the contrary, is intended to cover various modifications and equivalent arrangements included within the spirit and scope of the appended claims.

DESCRIPTION OF SYMBOLS

80: Organic insulating layer
81, 82, 86: Connecting member
100: Thin film transistor array panel
110: Insulation substrate
121: Gate line
124: Gate electrode
125: Common voltage line
129: Gate pad portion
131: First field generating electrode
140: Gate dielectric layer
151, 154, 159: Semiconductor
161, 163, 165, 169: Ohmic contact
171: Data line
173: Source electrode
175: Drain electrode
179: Data pad portion
180x: First passivation layer 180y: Second passivation layer
181, 182, 185b, 186a, 186b: Contact hole
191: Second field generating electrode
400: First photosensitive film pattern

What is claimed is:

1. A method of manufacturing a thin film transistor array panel, comprising:
    forming a gate line and a data line over an insulation substrate;
    forming an organic layer over the gate line and the data line;
    stacking a conductive layer over the organic layer;
    forming a first photosensitive film pattern over the conductive layer;
    forming a first field generating electrode by etching the conductive layer using the first photosensitive film pattern as a mask;
    deforming at least a portion of the first photosensitive film pattern to contact the organic layer; and
    forming an organic insulating layer including at least a contact hole by etching the organic layer using the first photosensitive film pattern as a mask.

2. The method of claim 1, wherein the first photosensitive film pattern and the organic layer make contact with each other through a hard bake process.

3. The method of claim 2, wherein the temperature of the hard bake process is equal to or higher than about 130° C.

4. The method of claim 2, further comprising:
    forming a first passivation layer under the organic layer;
    forming a second passivation layer over the first field generating electrode; and
    forming a second field generating electrode over the second passivation layer.

5. The method of claim 1, wherein the first photosensitive film pattern has a thickness equal to or greater than that of the organic layer.

6. The method of claim 2, wherein the contact hole of the organic insulating layer coincides with or is smaller than an opening of the first field generating electrode which overlaps the contact hole.

7. The method of claim 1, wherein the organic insulating layer comprises a non-photosensitive material.

8. The method of claim 4, wherein the at least a contact hole comprises:
    a first contact hole exposing at least a part of the gate pad portion and overlapping an opening of the first field generating electrode; and
    a second contact hole exposing at least a part of the data pad portion and overlapping another opening of the first field generating electrode, and
    wherein at least one of the first and second contact holes coincides with or is smaller than the corresponding opening of the first field generating electrode, and has a tapered structure.

9. The method of claim 8, wherein the at least a contact hole further comprises a drain electrode contact hole exposing at least a part of the drain electrode,
    wherein the second field generating electrode is connected to the drain electrode through the drain electrode contact hole, and
    wherein the drain electrode contact hole has a tapered structure.

10. The method of claim 4, wherein one of the first and second field generating electrodes has a plate shape, and the other one has a grating shape.

* * * * *